United States Patent [19]

Brown

[11] Patent Number: 5,729,180
[45] Date of Patent: Mar. 17, 1998

[54] CONTROL OF VCO IN ULTRASONIC FLOW METER

[75] Inventor: Alvin E. Brown, Santa Cruz, Calif.

[73] Assignee: Dieterich Technology Holding Corp., Boulder, Colo.

[21] Appl. No.: 726,094

[22] Filed: Oct. 4, 1996

[51] Int. Cl.$^6$ ............... G01F 1/66; H03L 7/00
[52] U.S. Cl. ........... 331/17; 73/861.27; 73/861.28; 331/65
[58] Field of Search ............ 331/17, 65; 73/861.27, 73/861.28, 861.29, 861.31

[56] References Cited

U.S. PATENT DOCUMENTS

| | | | |
|---|---|---|---|
| 3,824,483 | 7/1974 | Margala et al. | 331/17 |
| 4,509,372 | 4/1985 | Mount | 73/861.28 |
| 4,557,148 | 12/1985 | Akiyama | 73/861.28 |
| 5,639,971 | 6/1997 | Brown | 73/861.28 |

*Primary Examiner*—Siegfried H. Grimm
*Attorney, Agent, or Firm*—Richard W. Hanes

[57] ABSTRACT

An apparatus for controlling a voltage controlled oscillator (20) in an ultrasonic flow meter (18) includes a comparator (28) for comparing a received signal to an estimate signal, to form an early-late signal (32). The early-late signal (32) is received by a counter (36) to form a count signal (38). A digital to analog converter (42) receives the count signal (38) and converts it to a control voltage output (40) that is coupled to the voltage controlled oscillator (20).

18 Claims, 4 Drawing Sheets

CONTROL OF VCO IN ULTRASONIC FLOW METER

FIELD OF THE INVENTION

The present invention relates generally to the field of ultrasonic flow meters and more particularly to an apparatus and method for controlling a voltage controlled oscillator.

BACKGROUND OF THE INVENTION

Ultrasonic flow meters have many advantages over other methods of determining flow rates. Ultrasonic flow meters can continuously measure the flow rate, while other methods generally measure average flow rates. In addition, ultrasonic flow meters are obstructionless and work with non-conductive fluids.

Ultrasonic flow meters have a pair of transducers that are placed on either side of the flow path of a fluid flowing through a pipe. The transducers are pointed at each other and placed on either side of the flow path of a fluid flowing through a pipe. The transducers are pointed at each other and the line between them has a component in the direction of the fluid flow. The principle used to detect flow rates is that the transit time of an ultrasonic packet will increase in the upstream and decrease in the downstream path. The amount by which the transit time changes is directly proportional to the flow rate. An upstream voltage controlled oscillator (VCO) is synchronized so that upstream transit time is an integer multiple of a period of the upstream VCO signal. Similarly, a downstream voltage controlled oscillator is synchronized so that the downstream transit time is an integer multiple of a period of the downstream VCO signal. The voltage controlled oscillators are controlled by a voltage source. Typically, this voltage source is an operational amplifier configured as an integrator. The integrator sums an early-late error control signal, this increases the voltage (frequency) when the period of the VCO signal is too long and decreases the voltage when the period of the VCO signal is too short. Unfortunately, if the signal is interrupted the control voltage from the integrator starts to drift. When the signal is applied again, the VCO is no longer synchronized and has to reacquire synchronization. This process takes time and results in the ultrasonic flow meter being unable make flow measurements during the period.

Thus there exists a need for an apparatus and method for controlling a voltage controlled oscillator in an ultrasonic flow meter that does not drift when the signal is interrupted.

SUMMARY OF THE INVENTION

An apparatus for controlling a voltage controlled oscillator in an ultrasonic flow meter that overcomes these and other problems includes a comparator for comparing a received signal to an estimate signal, to form an early-late signal. The early-late signal is received by a counter to form a count signal. A digital to analog converter receives the count signal and converts it to a control voltage output that is coupled to the voltage controlled oscillator.

DETAILED DESCRIPTION OF THE DRAWINGS

The invention uses a digital counter to increment or decrement a control voltage of a voltage controlled oscillator. The counter is incremented by an early-late signal from a comparator. The output of the counter is converted to a voltage by a digital to analog converter. The counter holds its count, when the signal is interrupted. As a result the ultrasonic flow meter does not have to resynchronize after the signal has been interrupted.

Figure 1:
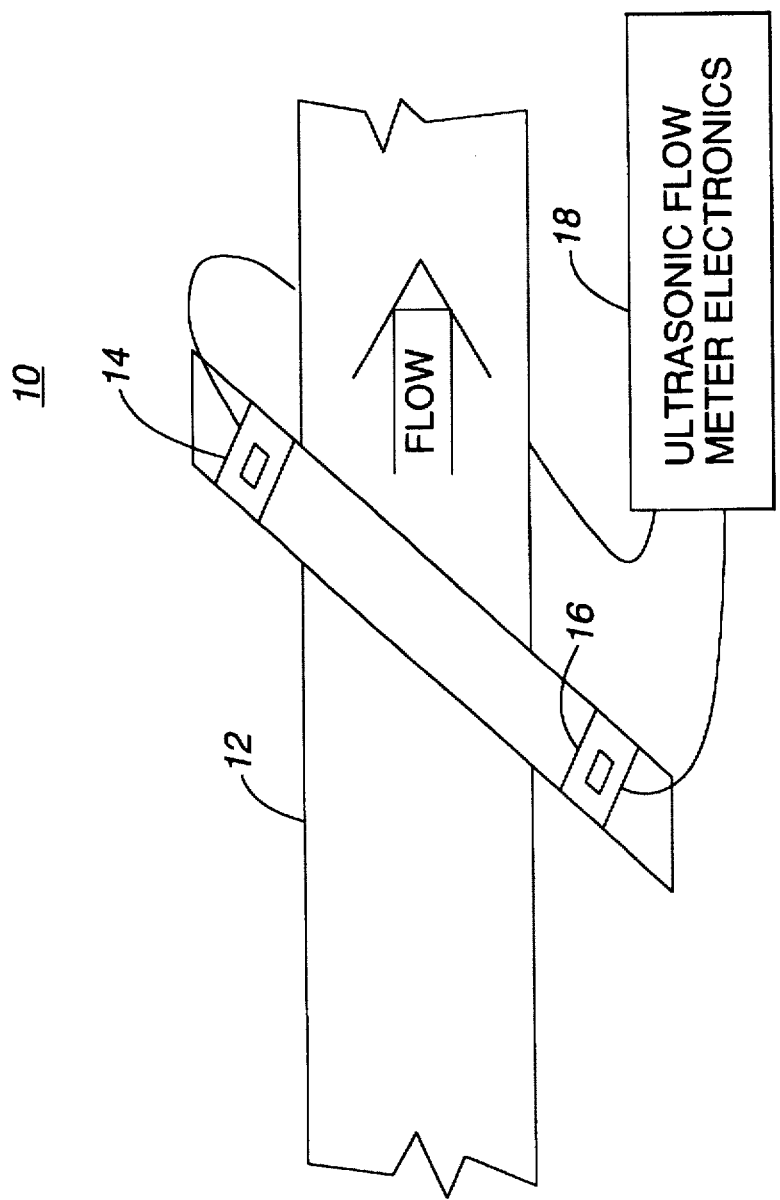
FIG. 1 is a block diagram of an ultrasonic flow meter connected to a conduit.

FIG. 1 is a block diagram of an ultrasonic meter 10 attached to a conduit 12. A pair of transducers 14, 16 are fixed inside the conduit 12. The pair of transducers 14, 16 are coupled to an ultrasonic flow meter electronics 18. The electronics 18 perform all the functions necessary to determine the volume flow rate of the fluid in the conduit 12.

Figure 2:
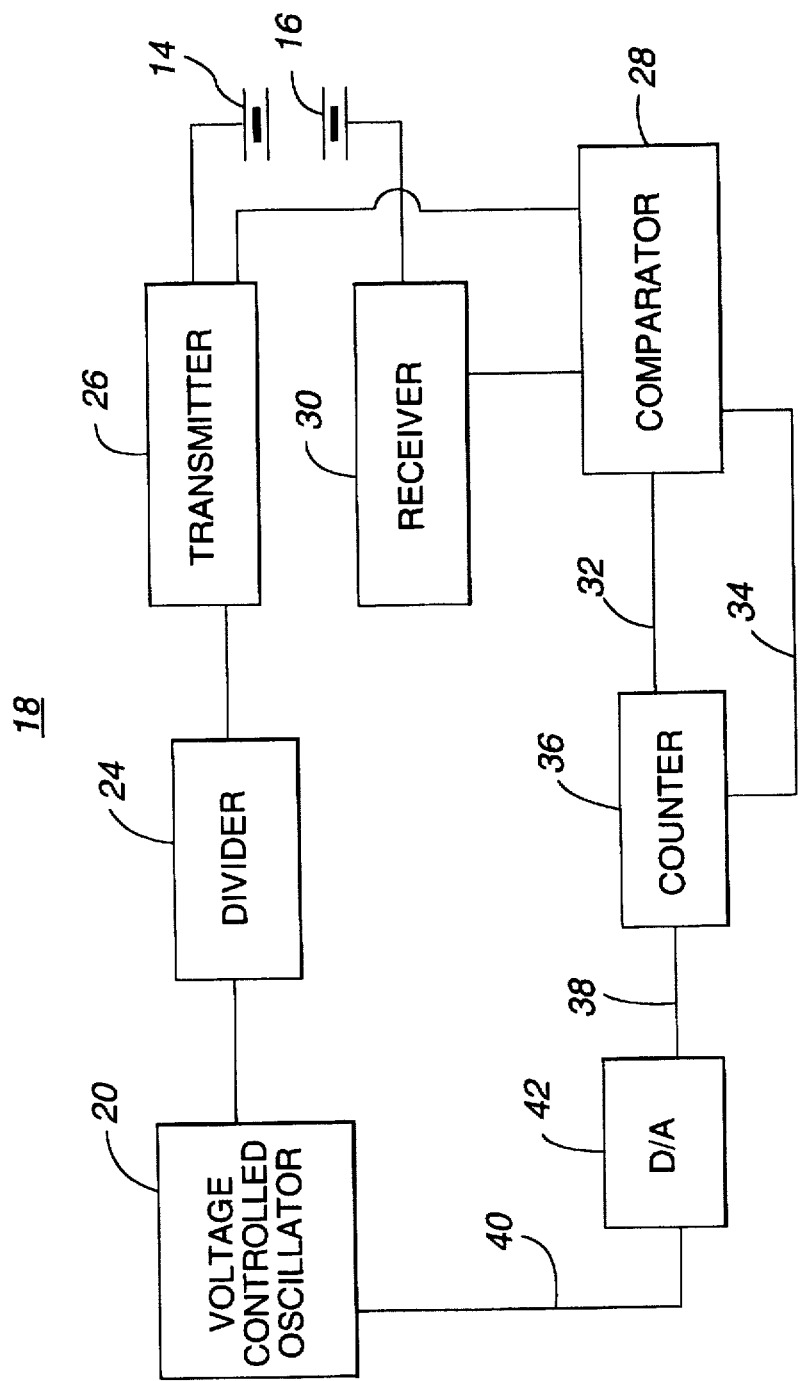
FIG. 2 is a block diagram of the ultrasonic flow meter.

FIG. 2 is a block diagram of the ultrasonic flow meter electronics 18. The block diagram only shows a single voltage controlled oscillator (VCO). Generally there are two VCOs, one for the upstream and one for the downstream measurements. However, both VCOs operate similarly and the explanation of the operation of the invention is simplified by considering only one of the VCOs. The voltage controlled oscillator 20 is coupled to a divider 24 that reduces the frequency of the VCO signal. The output of the divider 24 is coupled to a transmitter 26. The transmitter 26 generates a transmit sequence that is applied to one of the transducers 14. The transmitter also generates an estimate sequence that is sent to the comparator 28. A receiver 30 coupled to the receive transducer 16, generates a detection signal. The detection signal and the estimate sequence are compared in the comparator 28. The comparator (comparator circuit) 28 forms an early-late signal 32 (error signal) and a control signal 34. A counter 36 counts the early-late signal pulses to form a count signal 38. The count signal (count) 38 is converted into an analog control voltage (voltage level) 40 by a digital to analog converter 42. The control voltage 40 controls the frequency of the voltage controlled oscillator 20.

Figure 3:
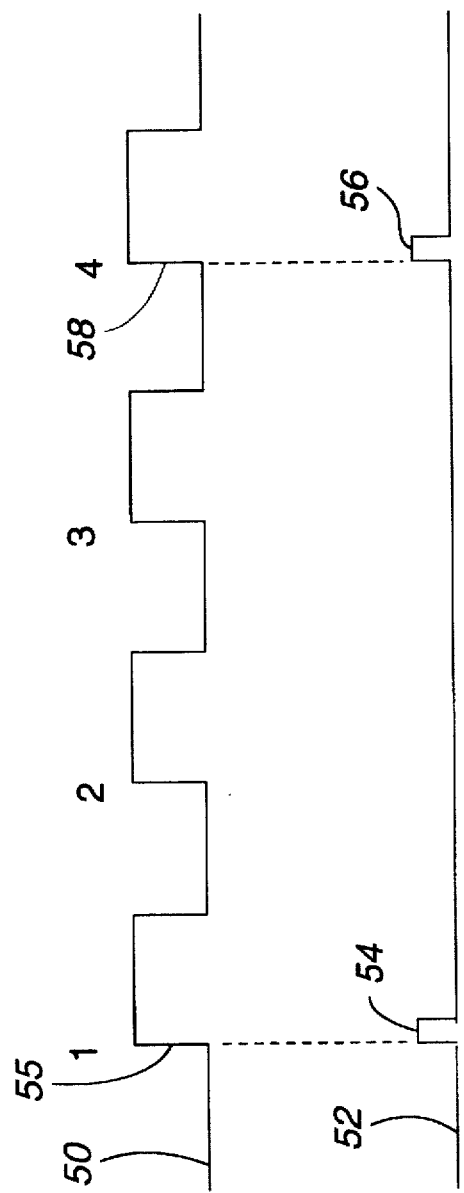
FIG. 3 is a timing diagram of a plurality of signals used in the ultrasonic flow meter of FIG. 2.
Figure 4:
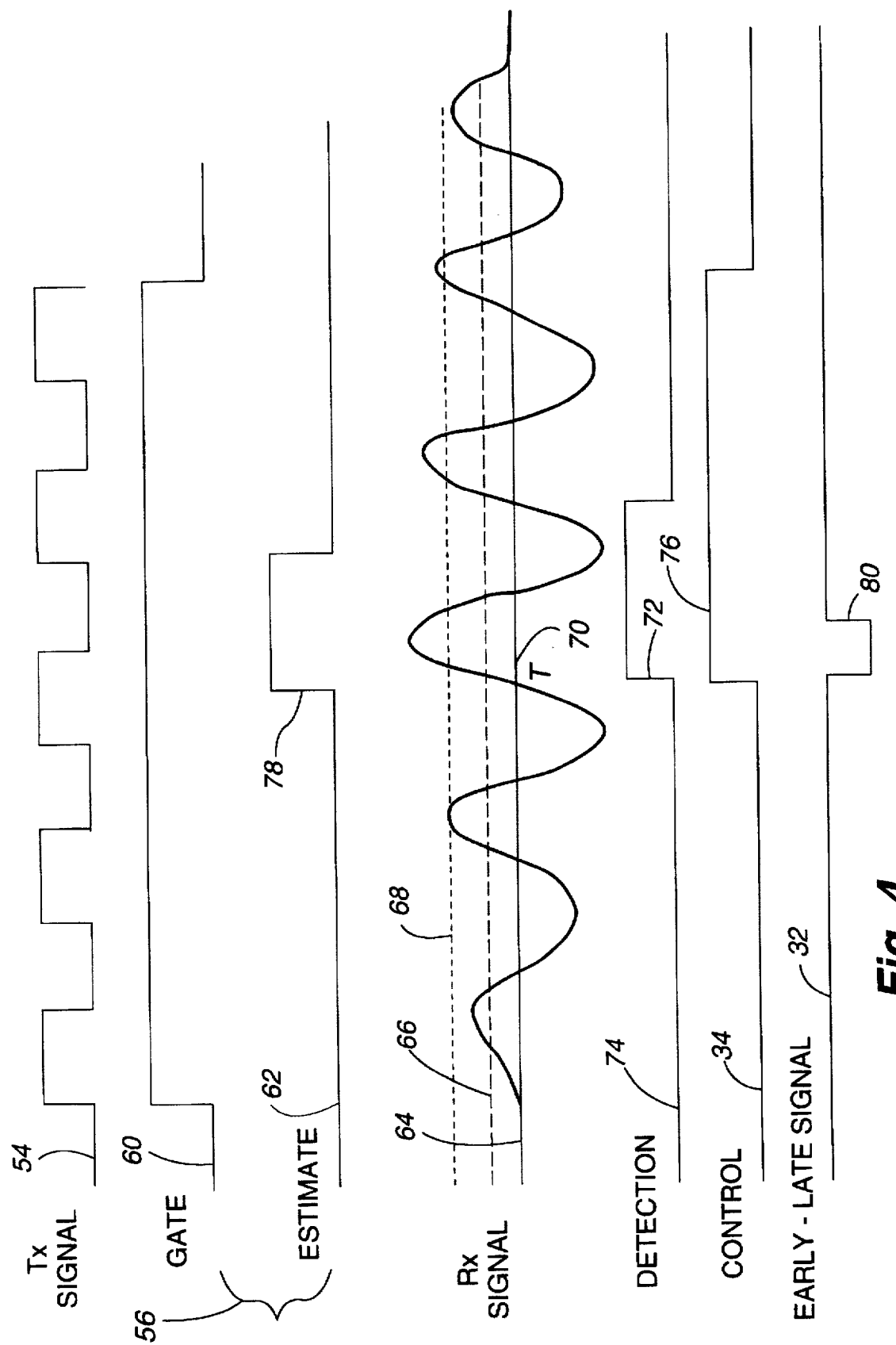
FIG. 4 is a timing diagram of a plurality of signals used in the ultrasonic flow meter of FIG. 2.

The operation of the ultrasonic flow meter of FIG. 2 will be explained in conjunction with the timing diagrams of FIG. 3 and FIG. 4. The VCO signal after being divided down is shown in FIG. 3 as signal 50. The signal 50 is used to control the operation of the transmitter 26. The transmitter signal 52 shows that the transmitter 26 generates a transmit sequence 54 on a first rising edge 55 of the divided VCO signal 50. A predetermined number of cycles later the transmitter 26 generates a comparison sequence 56. The transmit sequence 54 and the comparison sequence 56 are shown in detail in FIG. 4. The transmit signal 54 is a square wave having a frequency approximately equal to the natural frequency of the transducer. The comparison sequence 56 occurring several cycles (predetermined time) of the divided VCO later than the transmit signal 54, is really composed of a gate signal 60 and an estimate signal 62. The signal at the receiver 30 is shown as receiver signal 64. The receiver 30 uses a two threshold detection scheme. A first threshold 66 is a wake-up call for the receiver 30. When the received signal passes through the first threshold 66 and a second threshold 68, the receiver is armed and detects the next positive going zero crossing 70. This generates a positive going edge 72 on a detection signal 74. The detection signal is generated by the receiver 30. The comparator 28 first determines if the gate signal (gate pulse) 60 overlaps the rising edge (detection pulse) 72 of the detection signal 74. When there is an overlap a control signal 34 generated by the comparator is true 76. The control signal 34 is false when there is not an overlap. The counter 36 increments and decrements a least significant bit when the control signal is true. The counter increments and decrements a predetermined bit (e.g., bit 7 of a 16 bit counter) if the control signal is false. This results in the VCO's frequency adjusting in bigger increments when the detection signal is not closely aligned with the transit time and adjusting in smaller increments when the detection signal is closely aligned with the transit time. The early-late signal 32 is generated by comparing the detection signal 72 with the estimate signal 62. The early-late signal 32 in one embodiment is two separate signal lines (i.e., one for early and one for late). In another embodiment the early-late signal 32, indicates an estimate point 78 of the estimate signal 62 was earlier than the detection point (detection edge) 72, by sending a negative going pulse (early pulse) 80. When the estimate point 78 is later than the detection point 72, this is indicated by a positive going pulse (late pulse) of the early-late signal. In this embodiment the counter knows whether to count up or down depending the polarity of the pulse. A number of variations on the mechanism for counting up or down will be obvious to those skilled in the art.

The early-late signal 32 is used to increment and decrement the counter 36. In one embodiment the counter is a twos complement counter and has an initial state defined by a most significant bit being set to a logical one and the other (non-most significant bit) bits set to a logical zero (e.g., 10000000). This causes the digital to analog converter to start at the mid-range at counter reset.

Another embodiment, starts the counter at all zeros. Then if a count down occurs the counter is at all ones. The digital to analog converter 42 is then a "twos" complement digital to analog converter 42. Note that if the most significant bit is a one in this embodiment the count is negative and the frequency of the VCO 20 should be reduced. When the most significant bit is a zero the count is positive and the frequency of the VCO 20 should be increased.

Thus there has been described an apparatus and method for controlling a voltage controlled oscillator in ultrasonic flow meter, that does not drift when the signal is interrupted. While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. An apparatus for controlling a voltage controlled oscillator in an ultrasonic flow meter, comprising:
   a comparator comparing a received signal and an estimate signal;
   a counter receiving an early-late signal from the comparator; and
   a digital to analog converter receiving a count signal from the counter and having a control voltage output coupled to the voltage controlled oscillator.

2. The apparatus of claim 1, wherein the comparator has a control signal that is true when a gate pulse and a detection pulse overlap.

3. The apparatus of claim 2, wherein the early-late signal increments or decrements a least significant bit of the counter when the control signal is true.

4. The apparatus of claim 2, wherein the early-late signal increments or decrements a predetermined bit of the counter when the control signal is false.

5. The apparatus of claim 2, wherein the gate pulse is generated by a transmitter.

6. The apparatus of claim 2, wherein the detection pulse is generated by a receiver.

7. The apparatus of claim 1, wherein the counter has an initial state defined by a most significant bit being set to a logical one and a non-most significant bit set to a logical zero.

8. The apparatus of claim 1, wherein the digital to analog converter is a twos complement digital to analog converter.

9. A method of controlling a voltage controlled oscillator in an ultrasonic flow meter, comprising the steps of:
   (a) comparing an estimate sequence and a detection signal to form an early-late signal;
   (b) counting a late pulse on the early-late signal and subtracting an early pulse on the early-late signal to form a count; and
   (c) converting the count to a voltage level used to control the voltage controlled oscillator.

10. The method of claim 9, wherein step (a) further includes the steps of:
    (a1) generating a gate signal at a predetermined time after a transmit signal is generated;
    (a2) comparing the gate signal with the detection signal;
    (a3) generating a control signal that is true when the detection signal is true while the gate signal is true.

11. The method of claim 10, further including the step of:
    (a4) when the detection signal is not true while the gate signal is true, the control signal is false.

12. The method of claim 11, further including the steps of:
    (a5) comparing an estimate signal to the detection signal to form the early-late signal.

13. The method of claim 12, wherein step (b) further includes the steps of:
    (b1) when the control signal is true, incrementing and decrementing a least significant bit;
    (b2) when the control signal is false, incrementing and decrementing a predetermined bit.

14. An apparatus for controlling a voltage controlled oscillator in an ultrasonic flow meter, comprising;
    a transmitter generating a transmit sequence and a gate signal;
    a receiver generating a detection signal;
    a comparator circuit coupled to the gate signal and the detection signal and generating an early-late signal;
    a counter receiving the early-late signal and generating a count; and
    an analog to digital converter receiving the count and generating a control voltage that is coupled to the voltage controlled oscillator.

15. The apparatus of claim 14, wherein the comparator circuit generates a control signal that is true, when the gate signal is true during a detection edge of the detection signal.

16. The apparatus of claim 15, wherein the control signal is false, when the gate signal is not true during the detection edge.

17. The apparatus of claim 16, wherein the early-late signal increments and decrements a least significant bit of the counter, when the control signal is true.

18. The apparatus of claim 17, wherein the early-late signal increments and decrements a predetermined bit of the counter, when the control signal is false.

* * * * *